(12) United States Patent
Balkan et al.

(10) Patent No.: US 8,949,756 B2
(45) Date of Patent: Feb. 3, 2015

(54) DEBUG ACCESS WITH PROGRAMMABLE RETURN CLOCK

(75) Inventors: Deniz Balkan, Santa Clara, CA (US); Kevin R. Walker, Los Gatos, CA (US); Mitchell P. Lichtenberg, Jr., Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 1090 days.

(21) Appl. No.: 12/965,281

(22) Filed: Dec. 10, 2010

(65) Prior Publication Data
US 2012/0150479 A1    Jun. 14, 2012

(51) Int. Cl.
*G06F 17/50* (2006.01)
*G01R 31/317* (2006.01)

(52) U.S. Cl.
CPC .... *G01R 31/31705* (2013.01); *G01R 31/31727* (2013.01)
USPC .......................................... 716/113; 716/132

(58) Field of Classification Search
CPC .................................. G06F 17/50; G06F 9/455
USPC .................................................. 716/113, 132
See application file for complete search history.

(56) References Cited

U.S. PATENT DOCUMENTS

| | | | |
|---|---|---|---|
| 5,978,902 A | 11/1999 | Mann | |
| 6,567,932 B2 | 5/2003 | Edwards et al. | |
| 6,681,359 B1 | 1/2004 | Au et al. | |
| 7,412,633 B2 | 8/2008 | Kimelman et al. | |
| 7,930,604 B1* | 4/2011 | Azimi et al. | 714/724 |
| 8,024,631 B1* | 9/2011 | Bertanzetti | 714/729 |
| 8,103,918 B2* | 1/2012 | Aitken | 714/718 |
| 2005/0192791 A1 | 9/2005 | Mayer | |

OTHER PUBLICATIONS

Dimitry Akselrod, et al., "Debug Port Controller Architectures for System-on-Chip Integrated Circuits," 2008 IEEE, 6 pages.

\* cited by examiner

*Primary Examiner* — Thuan Do
(74) *Attorney, Agent, or Firm* — Meyertons, Hood, Kivlin, Kowert & Goetzel, P.C.; Erik A. Heter (57) ABSTRACT

A debug port configured to generate and provide a return clock is disclosed. In one embodiment, an integrated circuit (IC) includes one or more functional units and a debug port (DP). The DP is configured to enable access by an external debugger to the functional unit(s) of the IC for debugging purposes. The DP includes circuitry that may generate a first clock signal that is provided to the functional unit(s) during debug operations. Receiving test result data at the DP may require a return clock signal that is not provided by the functional unit(s). Accordingly, the IC may include a clock modifier coupled to receive the first clock signal. The clock modifier may generate a second clock signal based on the first, the second clock signal being provided to the DP as a return clock signal.

15 Claims, 7 Drawing Sheets

DEBUG ACCESS WITH PROGRAMMABLE RETURN CLOCK

BACKGROUND

1. Field of the Invention

This invention relates to integrated circuits, and more particularly, to mechanisms for debugging integrated circuits.

2. Description of the Related Art

Integrated circuits (ICs) and electronic assemblies are typically tested prior to shipping to a customer. One such testing mechanism developed for testing connections of ICs to printed circuit boards (PCB's) is known as boundary scan. Boundary scan testing is based on the IEEE 1149.1 Standard, which is commonly known as Joint Test Action Group (JTAG). Although originally developed for boundary scan testing, the uses of the JTAG architecture have expanded in recent years. For example, JTAG ports are sometimes used to access internal functional blocks of an IC for testing. Moreover, the use of JTAG access ports has been further expanded for use in debugging IC designs as well as software designed to execute on such ICs.

The expanding use of JTAG access ports has spurred further development in providing internal access to ICs. Many ICs now include a debug port (DP) having multiple JTAG access ports coupled to various internal components. The DP may also include one or more serial wire port (SWPs), memory access ports, and other types of ports that enable the accessing of internal IC functional blocks for debugging purposes. Such access ports convey various signals to accessible functional blocks, including data signals and clock signals. For example, test input data, clock, and mode select signals may be conveyed to a functional block through a JTAG port, while test output data may be received through the JTAG port. Some ICs, such as processors, may also include debug registers. Such debug registers may be programmed by executing processor code.

SUMMARY

A debug port configured to generate and provide a return clock is disclosed. In one embodiment, an integrated circuit (IC) includes one or more functional units and a debug port (DP). The DP is configured to enable access by an external debugger to the functional unit(s) of the IC for debugging purposes. The DP includes circuitry that may generate a first clock signal that is provided to the functional unit(s) during debug operations. Receiving test result data at the DP may require a return clock signal that is not provided by the functional unit(s). Accordingly, the IC may include a clock modifier coupled to receive the first clock signal. The clock modifier may generate a second clock signal based on the first, the second clock signal being provided to the DP as a return clock signal.

In one embodiment, the IC is a processor having a number of different processor cores. A DP may provide access for an external debugger to each of the processor cores for sending and receiving data during debug operations. The DP may also provide a first clock signal to each of the processor cores. While the processor cores themselves are not arranged to provide a return clock signal, the first clock signal may be fed back through a clock modifier to produce a second clock signal that is received by the DP. The second clock signal may be used to synchronize data received from a processor core (e.g., resulting from a scan dump) during a test.

The DP may include an input for receiving a clock signal from an external debugger. The clock signal received from the external debugger may be provided to a finite state machine within the DP. The finite state machine may output the first clock signal, which may be received by the processor cores and the clock modifier. The clock modifier may produce the second clock signal by delaying edges of the first clock cycle by a predetermined number of cycles of the clock signal received from the external debugger. The second clock signal is then provided to the DP, as well as to the finite state machine. As a result, the frequency of both the first and second clock signals is less than that of the clock signal received from the external debugger.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit (IC) with Debug Port

Figure 1:
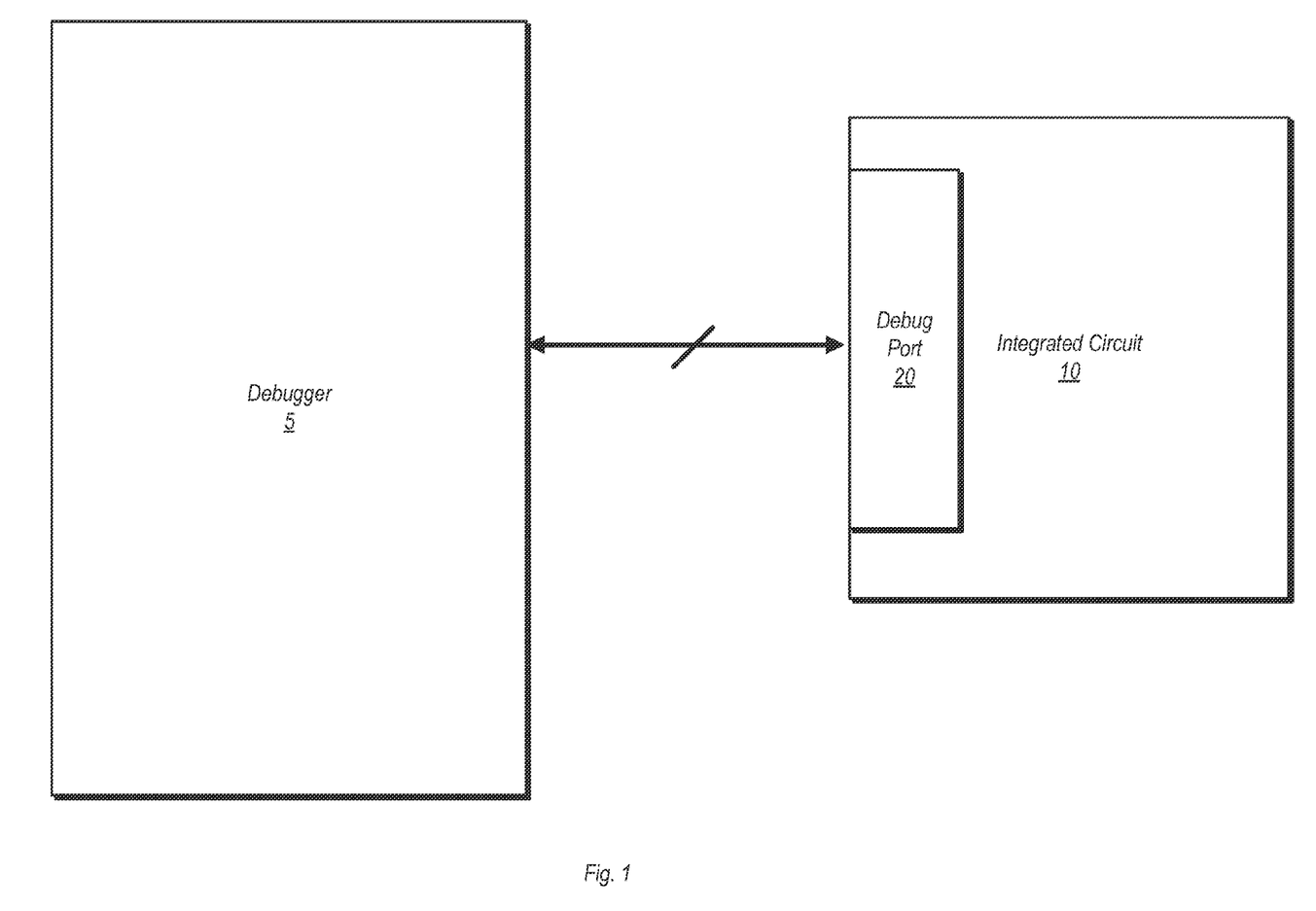
FIG. 1 is a block diagram illustrating a connection of an external debugger to one embodiment of an integrated circuit (IC) for accessing internal components thereof.

Turning now to FIG. 1, a block diagram illustrating a connection of an external debugger to one embodiment of an integrated circuit (IC) for accessing internal components thereof is shown. In the embodiment shown, IC 10 is coupled to external debugger 5 via debug port 20. Debugger 5 may be a computer system or other type of test equipment operable to perform various types of tests of IC 10 and components thereof. In particular, debugger 5 may be used in debugging the design of IC 10 and software written to execute thereupon. As defined herein, debugging may include determining if any hardware errors are present within IC 10. Debugging may also include determining whether or not software correctly executes on IC 10.

As will be discussed below, IC 10 may include a number of internal components that may be accessed by debugger 5 through debug port 20. Such components may include cores of a processor (e.g., execution cores), but may include other components as well (e.g., input/output units, etc.). Debugger 5 may provide test stimulus data to one or more components of IC 10 through debug port 20 and may initiate testing. Results of the test data may be received by debugger 5 through debug port 20. In addition to providing test stimulus data, debugger 5 may also provide various control signals and programming information to control certain operations within IC 10 during debugging. For example, when debugging software intended to execute on IC 10, debugger 5 may insert breakpoints to cause one or more components to stop operation and thus allow the state of such components to be retrieved for further analysis. Debugger 5 may also send control signals and programming information to IC 10 to cause certain components to be powered up, powered down, reset, or halted in various situations.

Figure 2:
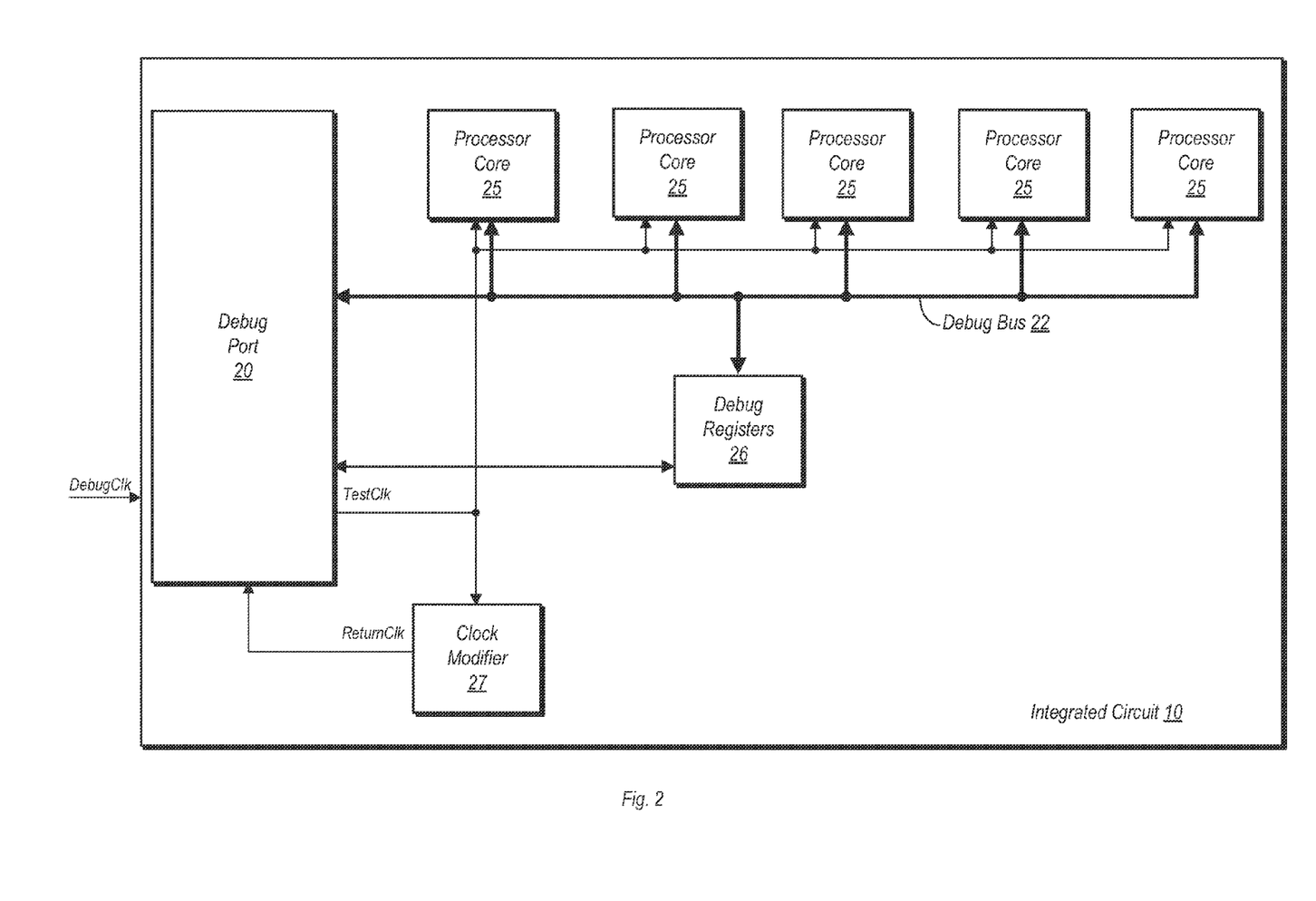
FIG. 2 is a block diagram of one embodiment of an IC.

FIG. 2 is a block diagram illustrating one embodiment of IC 10 in further detail. In the embodiment shown, IC 10 includes a plurality of processor cores 25 that are coupled to DP 20 via debug bus 22. IC 10 may be a heterogeneous (or asymmetric) multi-core processor in one embodiment, wherein various ones of the processor cores are different from each other. IC 10 may be a multi-core processor designed for use in a mobile platform, such as a smart phone, a laptop computer, or other mobile device, wherein each of the various processor cores 25 are dedicated to particular tasks. For example, one processor core 25 may be dedicated to performing audio-related tasks, another processor core 25 may be dedicated to graphics/video related tasks, while one or more other ones of the processor cores may be dedicated to executing instructions not explicitly related to audio and/or video tasks. It is noted however, that embodiments of IC 10 that implement a homogenous multi-core processor (i.e. where all processor cores are identical) are possible and contemplated. Other possible embodiments of IC 10 include application specific integrated circuits (ASICs) and other types of ICs.

IC 10 also includes a set of debug registers 26 coupled to debug bus 22. Debug registers 26 may include a number of different registers that may store information for use during debugging. Some of the registers may be used to trigger certain actions within IC 10 during debugging, while others may store information specifying certain conditions or parameters. Additional details of certain ones of registers 26 will be discussed below.

DP 20 in the embodiment shown may provide one or more physical connections for an external debugger (e.g., debugger 5 of FIG. 1) for performing debugging operations. These connections may include a Joint Test Action Group (JTAG) connection, a Serial Wire Debug (SWD) connection, and/or other types of connections that may be used with an external debugger. DP 20 may also include various types of functional circuitry to support these connections.

In the embodiment shown, DP 20 includes various internal logic circuitry that may provide certain control functions of DP 20 and other circuitry of IC 10 during debugging. Some of these control functions may be specified by information stored in debug registers 26, and thus DP 20 is coupled thereto via a bidirectional connection. Logic circuitry within DP 20 may thus write information into various ones of debug registers 26, and may also read information from the same. Furthermore, the logic circuitry in DP 20 may also have the capability of clearing certain ones of registers 26.

In this particular embodiment, DP 20 is coupled to receive a debug clock signal ('DebugClk'). The debug clock signal may be provided by an external debugger or from another source. The debug clock signal may be used to synchronize the transfer of information to and from IC 10. DP 20 is further coupled to provide a test clock ('TestClk') to each of processor cores 25. The test clock may be used to synchronize the transfer of information from DP 20 to the processor cores 25. However, none of processor cores 25 in the embodiment shown is coupled to provide a return clock to DP 20, even though one may be required in certain circumstances. Accordingly, IC 10 in the embodiment shown includes a clock modifier 27 that is coupled to receive the test clock and is further coupled to provide a return clock signal to DP 20. More particularly, clock modifier 27 may modify the test clock signal in order to generate the return clock signal. Information returned from the processors cores 25 to DP 20 may be synchronized to the return clock. The return clock signal may be provided to various individual ports of DP 20, such as a JTAG port.

As will be discussed below, the respective frequencies of the test and return clocks may be less than that of the debug clock. Furthermore, the phase of the return clock may be shifted with respect to that of the test clock. The amount of frequency division and/or phase shift may be set by one of registers 26 that may store a counter value.

Figure 3:
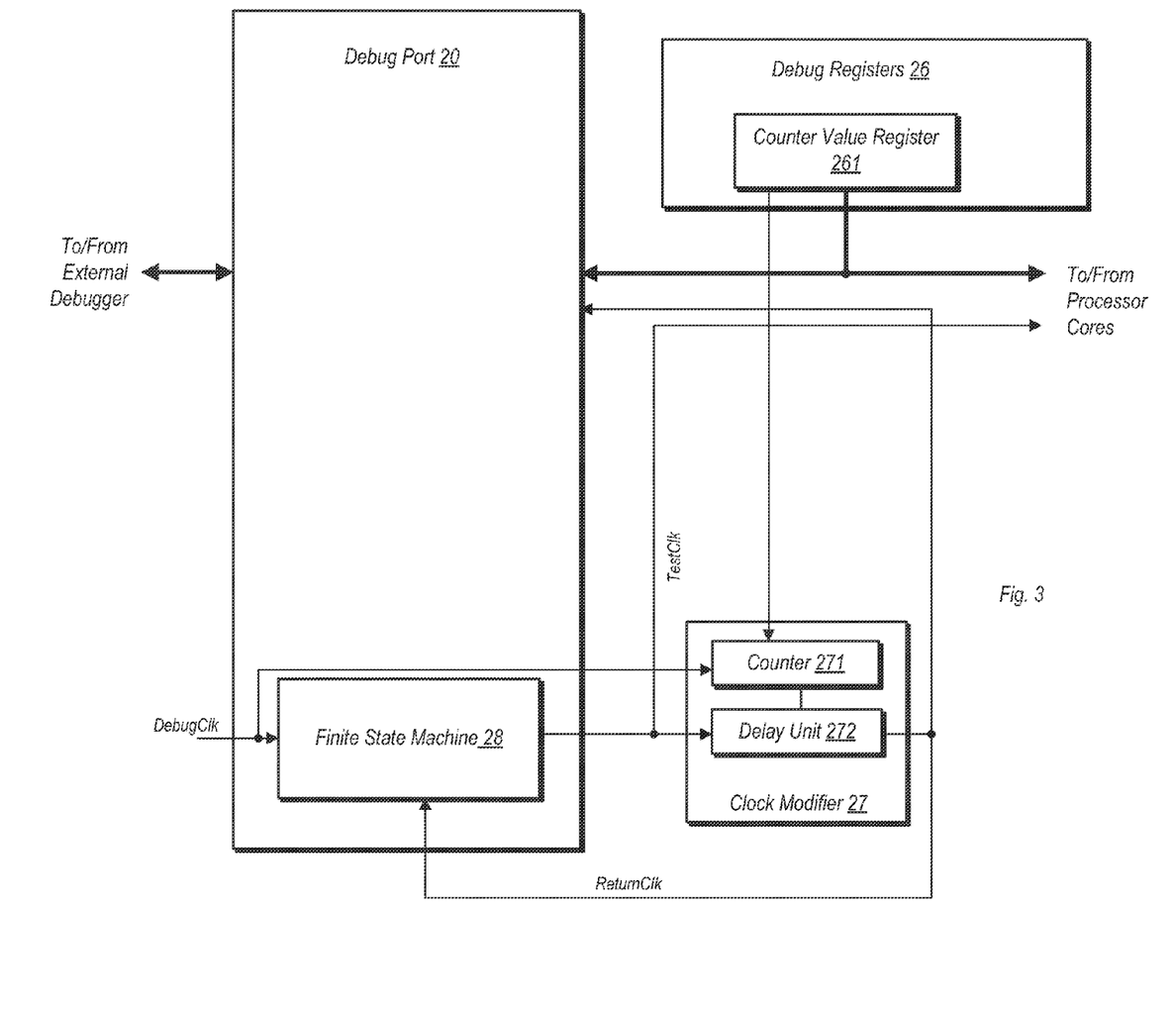
FIG. 3 is a block diagram illustrating one embodiment of a clocking apparatus used to produce a return clock.

Clock Generation Apparatus:

FIG. 3 is a block diagram illustrating one embodiment of a clocking apparatus used to produce a return clock. More particularly, FIG. 3 illustrates additional details of debug port 20, debug registers 26, and clock modifier 27.

In the embodiment shown, debug port 20 includes a finite state machine (FSM) 28 coupled to receive the debug clock signal. FSM 28 is further coupled to output the test clock signal, which may be received by each of the processor cores 25. The test clock signal may also be received by a delay unit 272 of clock modifier 27. In the embodiment shown, clock modifier 27 also includes a counter 271, which is coupled to receive the debug clock.

Counter 271 in the embodiment shown is configured to count a number of cycles of the debug clock, as specified by a value stored in counter value register 261. Delay unit 272 may provide a delay between the test clock cycle and the return clock cycle based on the value stored in counter value register 261. In some embodiments, a constant may be factored in, and thus delay unit 272 may provide some amount of delay even if the counter value register 261 is programmed with a value of zero. In either case, the amount of delay provided by delay unit 272 may reflect the value programmed into counter value register 261. Programming of counter value register 261 in one embodiment may be performed by an external debugger through DP 20. The programmed value stored in counter value register may be conveyed to counter 271 and thus the count value (and therefore the delay) may be set thereupon. Counter 271 may count up to at least the programmed value, and may count additional cycles if a constant is necessary. Once the terminal count is reached, counter 271 may cause the output of delay unit 272 to toggle in the same direction as the most recent edge of the test clock.

With respect to the test clock signal, the rising edge of the return clock signal is delayed by a predetermined number of debug clock cycles as reflected by the programmed value. Similarly, the falling edge of the return clock signal may also be delayed relative to the falling edge of the test clock signal by the same predetermined number of debug clock cycles. The return clock signal, delayed relative to the test clock signal, is fed back to FSM 28 in the embodiment shown.

FSM 28 in the embodiment shown is configured to produce the test clock signal at a reduced frequency, relative to the debug clock signal. More particularly, FSM 28 is configured to produce the test clock signal at the same frequency as the return clock signal responsive to receiving the return clock signal. In the embodiment shown, FSM 28 is configured to generate a rising edge of the test clock. Following generation of the rising edge of the test clock, FSM 28 is configured to generate the falling edge of the test clock responsive to receiving the rising edge of the return clock. Since the return clock is delayed with respect to the test clock, waiting until receiving the rising edge of the return clock to generate the falling edge of the test clock thus results in a lower frequency of the latter. Therefore, clock modifier 27, operating in conjunction with FSM 28, effectively functions to both delay the test clock signal as well as to divide the frequency of the test clock signal.

Figure 4:
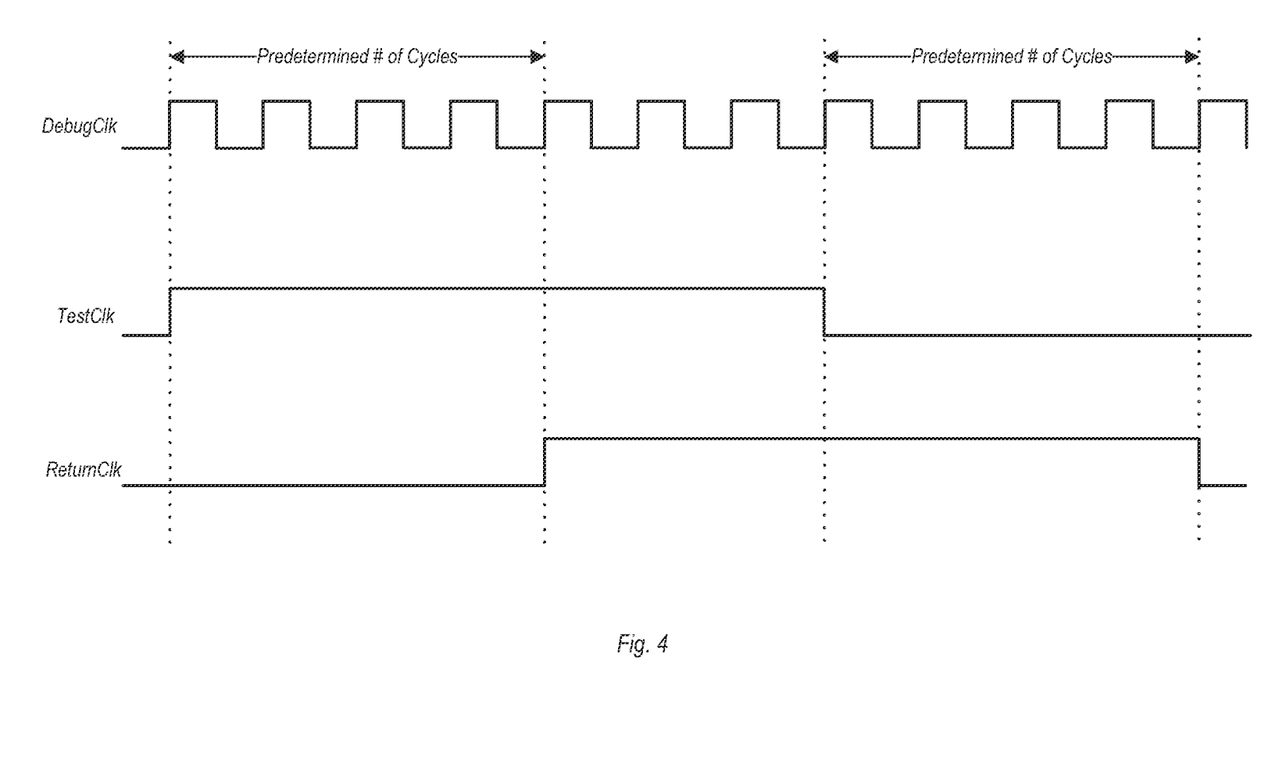
FIG. 4 is a timing diagram illustrating the relationship between the clock signals for one embodiment of a debug port.

FIG. 4 illustrates the relationship between the clock signals for one embodiment of the apparatus illustrated in FIG. 3. In the example shown, the rising edge of the return clock signal is delayed with respect to the rising edge of the test clock signal by a predetermined number of debug clock cycles (four in this particular case). Similarly, the falling edge of the return clock signal is delay by the same predetermined number of clock cycles with respect to the falling edge of the test clock signal. As noted above, the number of debug clock cycles which clock edges are delayed is based on a value programmed into counter value register 261. The number of debug clock cycles may also include a constant value. In FIG. 4, the value programmed into counter value register 261 may be two, with a constant value of two factored in, for a total value of four debug clock cycles of delay time. It is noted that these values are exemplary, and that other values may be programmed into counter value register 261, and other constant values may be implemented. It is also noted that the test clock and return clock signals may each have duty cycles of 50%.

Figure 5:
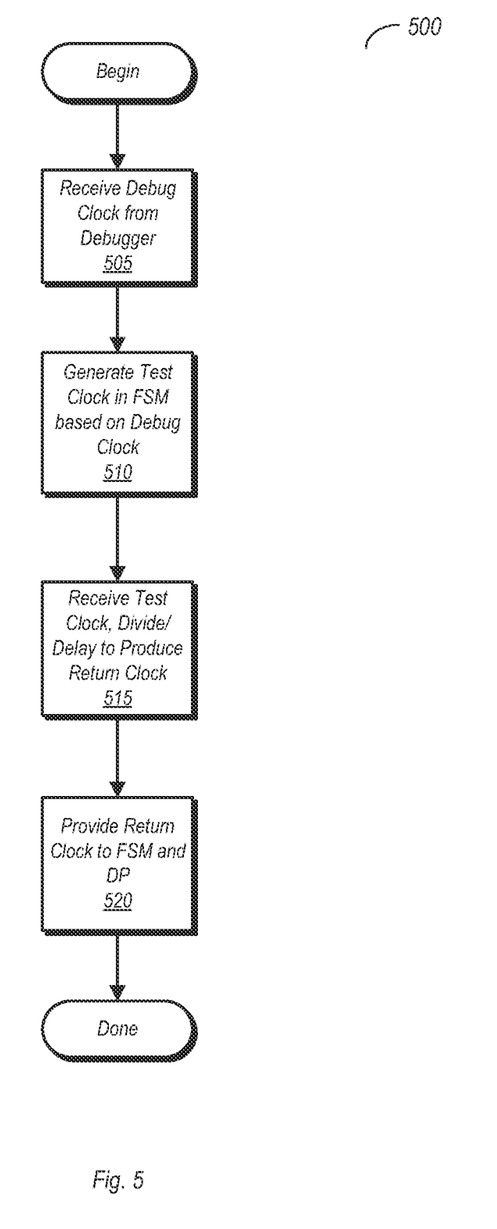
FIG. 5 is a flow diagram illustrating one embodiment of a method for producing a return clock signal.

Method Flow Diagrams:

FIG. 5 is a flow diagram illustrating one embodiment of a method for producing a return clock signal. The method illustrated by the flow diagram will be described in reference to the various hardware units discussed above. However, it is noted that the method may be applied to other hardware arrangements as well.

In the embodiment shown, method 500 begins with receiving a debug clock signal from a debugger or other external source (block 505). The debug clock signal may be received by FSM 28. FSM 28 may generate a test clock signal based on the debug clock signal (block 510). The test clock signal may be provided to the processor cores 25. Moreover, the test clock signal may be used to synchronize the transfer of information (e.g., test stimulus data).

The test clock signal may also be received by clock modifier 27. Clock modifier 27 may cause the edges of the test clock signal to be delayed to produce a return clock signal (block 515). In addition, the interaction between clock modifier 27 and FSM 28 may also cause the test clock and return clock signals to be produced at a divided frequency of the debug clock signal. Accordingly, the test and return clock signals may operate at frequencies that are more suitable for use in performing debug operations internally within IC 10, whereas the frequency of the debug clock signal may be too high for such operations (but may be more suitable for transferring information between IC 10 and debugger 5).

The return clock signal produced by clock modifier 27 may be fed back to FSM 28 and other circuitry within DP 20 (block 520). As noted above, providing the return clock signal to FSM 28 effectively creates a frequency divider in which the test and return clock signals are produced at a lower frequency than the debug clock signal.

Figure 6:
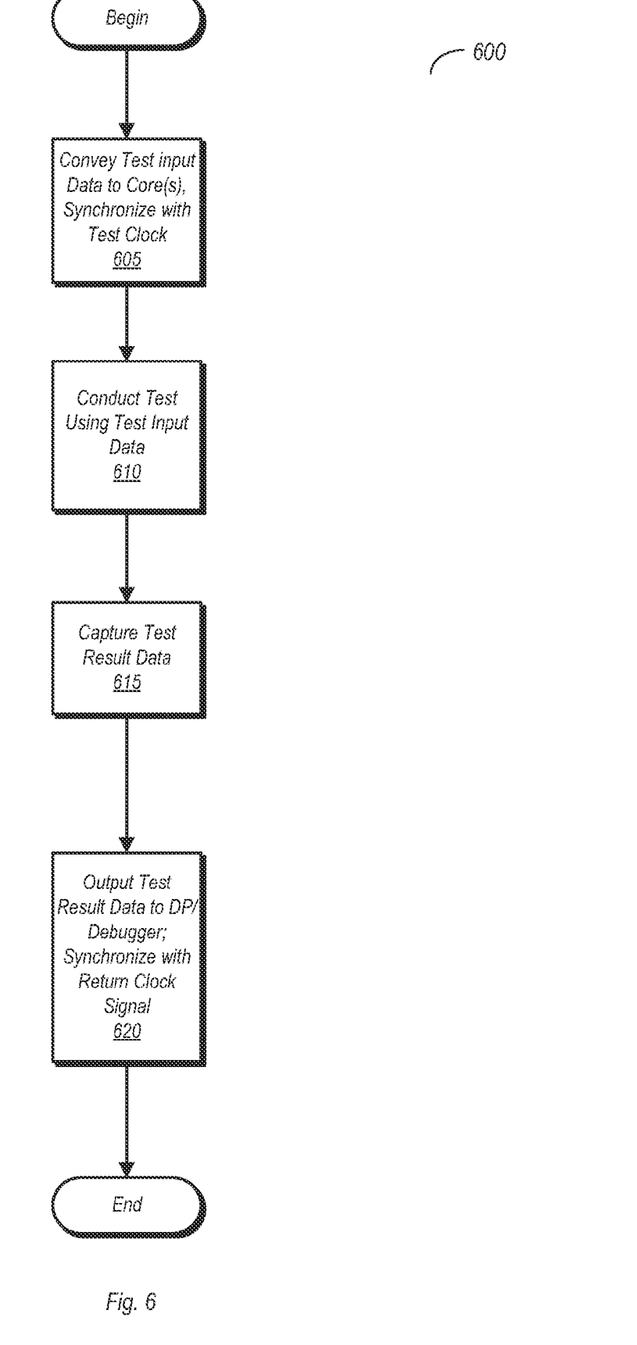
FIG. 6 is a flow diagram illustrating one embodiment of a test methodology.

FIG. 6 is a flow diagram illustrating one embodiment of a test methodology. As with FIG. 5, the methodology illustrated by the flow diagram of FIG. 6 will be described in reference to the hardware components previously discussed, but may apply to other hardware arrangements as well.

Method 600 begins with the conveying of test stimulus data to one or more of processor cores 25, wherein the test stimulus data is conveyed synchronous with a test clock signal (block 605). Upon completion, a test may be conduct using the test stimulus data (block 610). The test conducted may be one of several different types of tests. For example, the test may include providing a set of instructions including a breakpoint to a particular one of processor cores 25, executing the instructions up to the breakpoint, and capturing the state of the processor core 25. Scan testing is another one of many possible test type examples.

Upon completing the testing, the test result data may be captured (block 615), e.g., by scan elements or other types of circuitry. Subsequent to capturing the test data, it may be conveyed to DP 20 and eventually to debugger 5. When conveyed from a processor core 25 to DP 20, the data may be synchronized with a return clock signal (block 620). Subsequent to the test result data being received by DP 20, it may be provided to debugger 5 for analysis.

Figure 7:
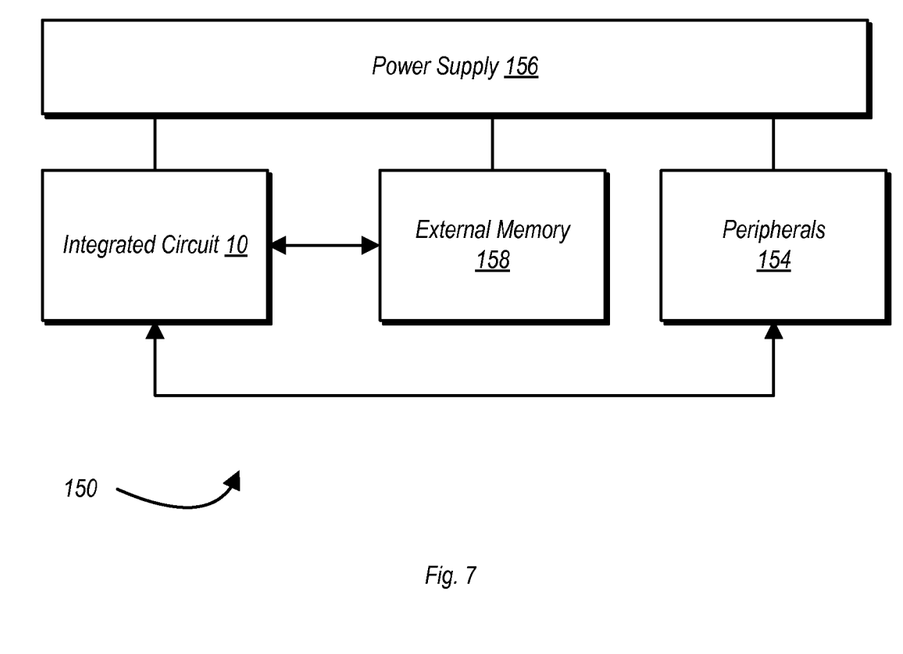
FIG. 7 is a block diagram of one embodiment of an exemplary system.

Exemplary System:

Turning next to FIG. 7, a block diagram of one embodiment of a system 150 is shown. In the illustrated embodiment, the system 150 includes at least one instance of an IC 10 (from FIGS. 1 and 2) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a functional unit;
at least one debug port configured to enable access to the functional unit wherein the debug port is coupled to provide a first clock signal to the functional unit; and
a clock modifier unit coupled to receive the first clock signal and configured to generate a second clock signal based thereupon, wherein the clock modifier is coupled to provide the second clock signal to the debug port wherein:
the debug port includes a finite state machine configured to receive a third clock signal and the second clock signal and configured to generate the first clock signal based on the second and third clock signals;
the clock modifier unit is configured to delay a transition of the first clock signal to produce the second clock signal;
a frequency of the first clock signal is reduced responsive to the clock modifier producing the second clock signal based on delaying a transition of the first clock signal; and
a clock edge of the second clock signal is delayed with respect to an equivalent clock edge of the first clock signal by n cycles of the third clock signal, wherein n is an integer value of at least one.

2. The integrated circuit as recited in claim 1, wherein respective frequencies of the first and second clock signals are equal, and wherein the frequency of each of the first and second clock signals is less than a frequency of the third clock signal.

3. A method comprising:
a debug port (DP) of an integrated circuit (IC) providing a first clock signal to a functional unit of the IC during a test operation;
a clock modifier receiving the first clock signal and generating a second clock signal based on the first, wherein generating the second clock signal comprises the DP receiving a third clock signal from an external source, wherein a frequency of the third clock signal is greater than that of the first clock signal, and wherein the clock modifier is configured to delay a clock edge of the second clock signal by a predetermined number of cycles of the third clock signal;
the DP receiving the second clock signal.

4. The method as recited in claim 3, further comprising conveying test stimulus data from the DP to the functional unit synchronous with the first clock signal, and conveying state data from the functional to the DP synchronous with the second clock signal.

5. The method as recited in claim 3, further comprising the clock modifier producing the second clock signal by dividing the first clock signal.

6. The method as recited in claim 3, wherein the frequency of the third clock signal is greater than that of the first and second clock signals.

7. The method as recited in claim 3, further comprising changing a frequency of the second clock signal responsive to changing a value stored in a register.

8. An integrated circuit comprising:
a debug port (DP) configured for coupling to an external debugger;
a plurality of functional units each coupled to the DP, wherein during a test mode, the DP is configured to convey a first clock signal to at one or more of the plurality of functional units; and
a programmable clock modifier coupled to receive the first clock signal and configured to generate a second clock signal based on the first clock signal, wherein the DP is configured to receive the second clock signal, wherein:
the DP is configured to generate the first clock signal based on a third clock signal received from an external source;
a frequency of the third clock signal is greater than that of the first clock signal; and
the programmable clock modifier is configured to delay a clock edge of the second clock signal by a predetermined number of cycles of the third clock signal.

9. The integrated circuit as recited in claim 8, wherein none of the plurality of functional units is configured to provide a return clock to the DP.

10. The integrated circuit as recited in claim 8, wherein the DP includes a register, and wherein the register is programmable to store the predetermined number of cycles of the third clock signal.

11. A processor comprising:
a plurality of processor cores;
a debug port coupled to each of the processor cores, wherein the debug port is configured to provide external access of a debugger to each of the plurality of processor cores, wherein the debug port is configured to generate and provide a first clock signal to each of the plurality of processor cores;
a return clock unit coupled to receive the first clock signal and configured to generate a second clock signal based on the first clock signal, wherein the return clock unit is further coupled to provide the second clock signal to debug port, wherein:
the debug port is configured to generate the first clock signal based on a third clock signal received from an external source;
a frequency of the third clock signal is greater than that of the first clock signal; and
the return clock unit is configured to delay a clock edge of the second clock signal by a predetermined number of cycles of the third clock signal.

12. The processor as recited in claim 11, wherein the debug unit includes a finite state machine configured to receive the third clock signal and configured to generate the first clock signal based on the third clock signal.

13. The processor as recited in claim 12, wherein the return clock unit is configured to delay the first clock signal by a predetermined number of cycles of the third clock signal in order to produce the second clock signals.

14. The processor as recited in claim 13, wherein the return clock unit is programmable with respect to the predetermined number of cycles of the third clock signal.

15. The processor as recited in claim 11, wherein the debug port is configured to convey test input data to each of the plurality of processor cores synchronous with the first clock signal, and wherein the debug port is further configured to receive test output data from each of the processor cores synchronous with the second clock signal.

* * * * *

UNITED STATES PATENT AND TRADEMARK OFFICE
CERTIFICATE OF CORRECTION

PATENT NO.      : 8,949,756 B2
APPLICATION NO. : 12/965281
DATED           : February 3, 2015
INVENTOR(S)     : Deniz Balkan et al.

It is certified that error appears in the above-identified patent and that said Letters Patent is hereby corrected as shown below:

In the Claims:

Claim 4, Column 7, Line 59, please delete "functional to" and substitute -- functional unit to --

Claim 8, Column 8, Line 9, please delete "to at one" and substitute -- to at least one --

Signed and Sealed this
Twenty-seventh Day of October, 2015

Michelle K. Lee
*Director of the United States Patent and Trademark Office*